United States Patent
Sparks

(10) Patent No.: US 6,923,625 B2
(45) Date of Patent: Aug. 2, 2005

(54) METHOD OF FORMING A REACTIVE MATERIAL AND ARTICLE FORMED THEREBY

(75) Inventor: Douglas Ray Sparks, Whitmore Lake, MI (US)

(73) Assignee: Integrated Sensing Systems, Inc., Ypsilanti, MI (US)

( * ) Notice: Subject to any disclaimer, the term of this patent is extended or adjusted under 35 U.S.C. 154(b) by 0 days.

(21) Appl. No.: 10/338,351

(22) Filed: Jan. 7, 2003

(65) Prior Publication Data

US 2003/0138656 A1 Jul. 24, 2003

Related U.S. Application Data

(60) Provisional application No. 60/345,532, filed on Jan. 7, 2002.

(51) Int. Cl.[7] .......................... F04F 11/00; F04B 37/02; H01J 7/18; H01J 35/20; H01L 23/20
(52) U.S. Cl. .................. 417/48; 417/51; 252/181.5; 252/181.6; 257/682; 428/660; 428/666; 428/672
(58) Field of Search .................. 118/715, 50; 313/553, 313/559, 560; 417/48, 49, 50, 51; 252/181.1, 181.2, 181.3, 181.4, 181.5, 181.6, 181.7; 257/682, 913; 428/603, 604, 610, 615, 669, 670, 671, 672, 673, 674, 686, 687, 68, 539.5, 666, 660

(56) References Cited

U.S. PATENT DOCUMENTS

| | | | | |
|---|---|---|---|---|
| 4,046,644 A | * | 9/1977 | Liska | 204/37 R |
| 4,827,188 A | * | 5/1989 | Hurst | 313/560 |
| 5,521,099 A | * | 5/1996 | Glaunsinger et al. | 436/151 |
| 5,612,560 A | * | 3/1997 | Chivukula et al. | 257/309 |
| 5,644,131 A | * | 7/1997 | Hansen | 250/292 |
| 5,861,665 A | * | 1/1999 | Derkits et al. | 257/682 |
| 6,559,596 B1 | * | 5/2003 | Arai et al. | 313/553 |
| 6,596,236 B2 | * | 7/2003 | DiMeo et al. | 422/88 |
| 2002/0197507 A1 | * | 12/2002 | Narasimhan et al. | 428/655 |
| 2004/0106001 A1 | * | 6/2004 | Kovacs et al. | 428/670 |

FOREIGN PATENT DOCUMENTS

EP   0 837 502 A2 * 4/1998

OTHER PUBLICATIONS

U.S. Appl. No. 09/965,759, filed Sep. 28, 2001, Kovacs et al.*

* cited by examiner

Primary Examiner—Michael La Villa
(74) Attorney, Agent, or Firm—Gary M. Hartman; Domenica N.S. Hartman; Hartman & Hartman

(57) ABSTRACT

A method for preventing contamination, oxidation and gas absorption of reactive materials, and articles formed thereby. The method generally entails depositing a first layer of a reactive material and a second layer of a substantially nonreactive material so that the second layer protects the first layer from a surrounding atmosphere. For example, the first and second layers may be deposited to form a film on a surface within a chamber that is desired to be maintained in a vacuum during use of the article. The second layer is sufficiently thin such that appropriately heating the first and second layers causes the reactive material of the first layer to become interdiffused with the nonreactive material of the second layer, to the extent that at least a portion of the reactive material is able to react and getter gases from the surrounding atmosphere.

20 Claims, 3 Drawing Sheets

METHOD OF FORMING A REACTIVE MATERIAL AND ARTICLE FORMED THEREBY

CROSS REFERENCE TO RELATED APPLICATIONS

This application claims the benefit of U.S. Provisional Application No. 60/345,532, filed Jan. 7, 2002.

STATEMENT REGARDING FEDERALLY SPONSORED RESEARCH

Not applicable.

BACKGROUND OF THE INVENTION (1) Field of the Invention

The present invention generally relates to the use of reactive materials, such as for gettering gases within an evacuated chamber. More particularly, this invention relates to a method of protecting a reactive material during processing so that the reactivity of the material is not degraded for the intended application.

(2) Description of the Related Art

The use of chemically reactive materials to getter gases is a well-known technique for improving the performance of vacuum devices. For example, reactive metals have been employed to reduce the trapped gas pressure of vessels and improve the performance of vacuum tubes, cathode ray tubes, display tubes, flat panel displays, sensors, resonators, micromachined devices, ion accelerators, etc. Evaporated films of barium and zirconium and powders, sputtered films of various reactive metals, and sintered non-evaporable getters (NEG's) in the form of pellets and strips have been employed for such applications. Getter materials often must be "activated," in which a high temperature vacuum bake is performed to desorb any absorbed gas molecules and to burn off any surface contaminants.

One difficulty with using a reactive material as a getter is that they can be contaminated by handling or through exposure to hot gases during processing steps prior to vacuum sealing. As taught by U.S. Pat. No. 5,191,980 to Boffito et al., an adhesive plastic layer can be applied to a reactive metal film to provide protection during storage and shipping, but must be removed prior to activation and use of the film as a getter material. Therefore, while plastic films of the type taught by Boffito et al. are useful to protect a getter material during shipping, a plastic film cannot protect a getter material during high temperature operation of the device in which film is installed. Furthermore, a plastic film must be removed prior to high temperature processing often required by microelectronic devices, such as many bonded panel and wafer configurations used in the microelectronics industry. During glass frit wafer and panel bonding techniques, glass frit is flowed in air at atmospheric pressure and at temperatures above 300° C. Exposure to these temperatures can degrade the gettering performance of a reactive metal film due to oxidation and gas absorption.

NEG's, commercial examples of which include sintered metal particles and strips available from SAES Getters SpA of Italy, develop an oxide layer during sintering that must be removed by an "activation" step, which involves heating to temperatures of 400° C. or more. Metals such as vanadium and niobium can be added to NEG materials to help reduce this oxide growth, thereby allowing gases to diffuse into the bulk of the material. Nevertheless, activation can require subjecting a NEG material to temperatures that can be incompatible with materials and processes used in the electronic industry.

In view of the above, it would be desirable if contamination, oxidation and gas absorption of a reactive material could be avoided or at least minimized during handling, storage and high temperature processing of a device in which the reactive material is to be used.

BRIEF SUMMARY OF THE INVENTION

The present invention provides a method for preventing contamination, oxidation and gas absorption of reactive materials, and articles formed thereby. The method generally entails depositing a first layer of a reactive material and a second layer of a substantially nonreactive material so that the second layer protects the first layer from the surrounding atmosphere. For example, the first and second layers may be deposited to form a film on a surface within a chamber that is desired to be maintained in a vacuum. The second layer is sufficiently thin such that appropriately heating the first and second layers causes the reactive material of the first layer to become interdiffused with the nonreactive material of the second layer, to the extent that at least a portion of the reactive material is able to react with the surrounding atmosphere. As such, an article formed by the method of this invention is characterized by first and second layers of reactive and substantially nonreactive materials, respectively, but with the reactive material of the first layer being sufficiently interdiffused through the overlying second layer so that reactive material can react with the surrounding atmosphere, either as a result of being exposed at the surface of the second layer or sufficiently near the surface of the second layer as to react with gases that diffuse into the second layer. If deposited as a getter material within a chamber, the chamber is preferably evacuated prior to interdiffusing the first and second layers, after which sufficient reactive material is present in the second layer to getter gases from the evacuated chamber.

In view of the above, it can be seen that a significant advantage of the present invention is that the invention overcomes the problem of contamination, oxidation and gas absorption of a reactive material by depositing a thin layer of a suitably nonreactive material, such as a noble metal, on a layer of the reactive material to form an environmentally protective layer. After the reactive material has been placed in its intended operating environment, solid-state diffusion of the reactive material into the protective nonreactive material is then used to "activate" the gettering action of the reactive material. A noble metal layer having a thickness on the order of about 5 to about 500 nm is believed to be sufficient to protect a reactive metal layer during typical processing of an electronic device, and still allow diffusion of the reactive metal atoms during a relatively short heat treatment at temperatures above 200° C., typically about 300° C. and higher.

Other objects and advantages of this invention will be better appreciated from the following detailed description.

DETAILED DESCRIPTION OF THE INVENTION

Figure 1:
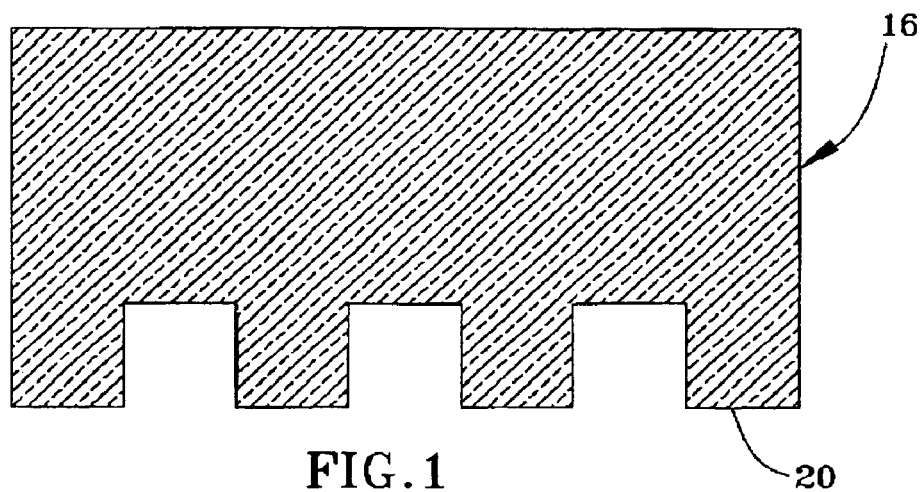
FIGS. 1 through 4 represent processing steps for forming a getter film in accordance with the present invention.
Figure 2:
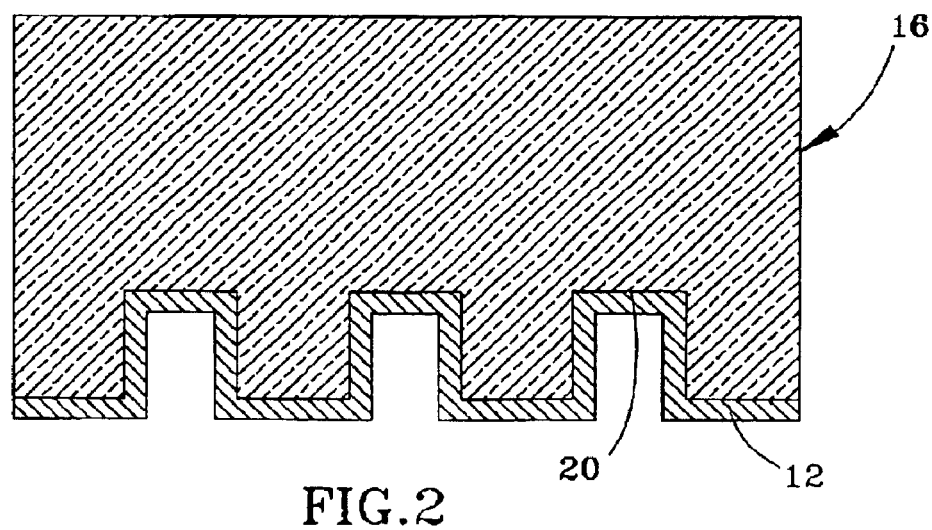
Figure 3:
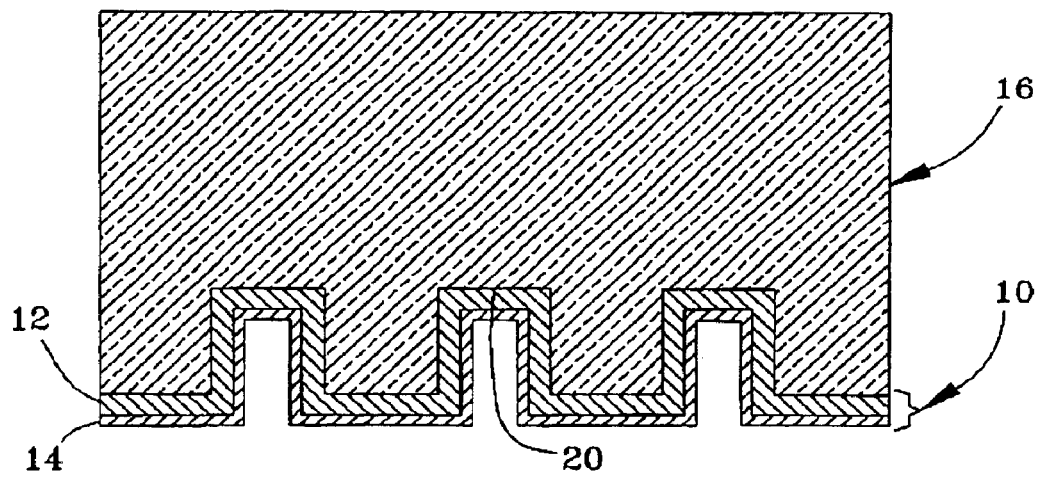

FIGS. 1 through 3 represent processing steps by which a getter film 10 is formed and protected to avoid or at least minimize contamination, oxidation and gas absorption of a layer 12 of a reactive material, which is a constituent of the film 10. As shown in FIG. 3, the film 10 comprises a thin protective film 14 that is sufficiently nonreactive to inhibit reactions between the reactive material layer 12 and the surrounding atmosphere during processing of a substrate 16 on which the getter film 10 is formed, and/or during processing of an article in which the getter film 10 will be used. Various reactive materials for the reactive layer 12 are within the scope of the invention, generally encompassing those materials that readily absorb and/or react with oxygen, hydrogen, nitrogen, water, carbon monoxide, carbon dioxide, and hydrocarbons. Carbon and carbon compounds are also within the definition used herein for reactive materials as a result of the ability of carbon and its compounds to absorb organic compounds, e.g., hydrocarbons, that may be targeted for gettering from an atmosphere. Therefore, reactive materials for use with the present invention include Al, carbon and its compounds, Si, Ge, and all Group 1A, 2A, 3A, 4A, 5A, 6A and 7A elements. Reactive materials of particular interest are Al, Ba, carbon and its compounds, Ca, Ce, Cr, Co, Fe, Hf, Mg, Mn, Mo, Nb, Ni, Si, Ta, Ti, Th, V, W, and Zr. Nonreactive materials believed to be suitable for use as the protective film 14 generally include Pb, Sn, In, and all Group 8A, 1B, 2B, and 3B metals (except Al, which is defined herein as reactive). Nonreactive materials of particular interest are Cu and the noble metals Ag, Au, Ir, Os, Pd, and Pt.

Figure 4:
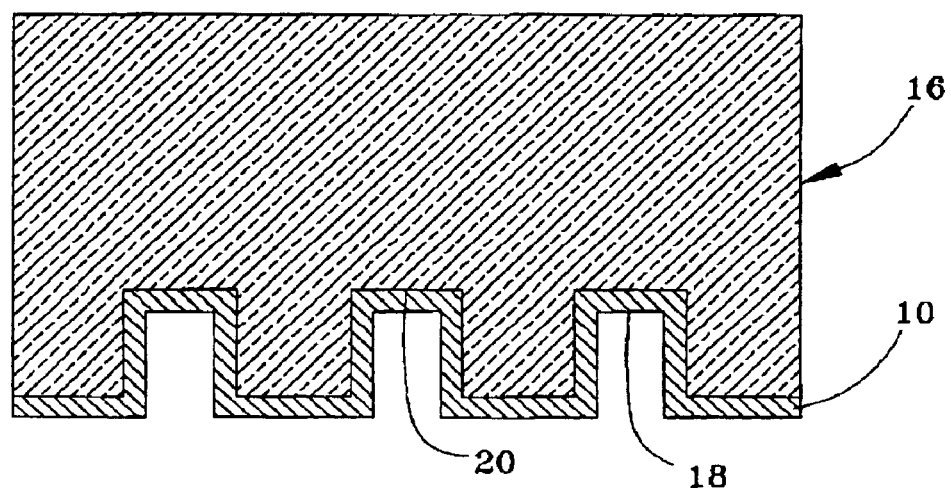

At high temperatures, generally above 200° C., atoms of the above-noted reactive materials are able to diffuse through a thin layer of one of the above-noted nonreactive metals, such that solid-state diffusion of atoms from the reactive material layer 12 into the protective layer 14 results in activation of the gettering action of the getter film 10. FIGS. 1 through 3 represent the sequence in which the reactive layer 12 and then the nonreactive protective film 14 are deposited on the substrate 16, which may be formed of a variety of materials, including semiconductors, metals, glass, ceramics, silicon, oxidized silicon, Pyrex, etc. Both the reactive material and the nonreactive metal are preferably deposited under vacuum by evaporation or sputtering, though various other techniques could be employed, including chemical vapor deposition (CVD), plasma deposition, spin-on deposition, spraying, screen printing, and other film deposition methods. After deposition, the reactive and protective layers 12 and 14 can be individually or collectively patterned using common photolithography and etch methods, lift-off methods, shadow masking, or other techniques commonly employed in the electronics and optics industry. The unreacted and uncontaminated layer 12 of reactive material is thus covered and protected by the thin protective layer 14 of nonreactive metal while still within the vacuum employed by the deposition process. During or at completion of the processing of an article in which the getter film 10 is to be used, a thermal treatment is performed at a temperature sufficient to cause atoms of the reactive material of the reactive layer 12 to diffuse through the thin protective layer 14, as represented by FIG. 4. Sufficient solid-state diffusion of atoms occurs to effectively activate the gettering action of the getter film 10 as a result of a sufficient amount of reactive material being present at or near the surface 18 of the getter film 10, which was originally defined entirely by the protective layer 14. However, even without activation, the protective layer 14 can be made sufficiently thin to permit most gases to diffuse through the protective layer 14 and into the reactive layer 12, at which point the gases are gettered.

As represented in FIGS. 1 through 4, the efficacy of the getter film 10 can be promoted by depositing the layers 12 and 14 on an uneven surface 20 of the substrate 16, which increases the surface area of the getter film 10. While the uneven surface 20 is shown in FIGS. 1 through 4 as being defined by channels, various other features could be defined in the substrate 16 to increase the surface area of the getter film 10, such as holes, pores, pillars, strips, trenches, etc. These surface features can be etched into substrates formed of silicon, glass, ceramic or metal using wet acid or caustic solutions, by plasma or laser etching, lapping, grinding, or another micromachining technique. In addition, the surface area of the getter film 10 can be effectively increased if the substrate 16 is formed of a porous sintered ceramic, glass or metal substrate.

Figure 5:
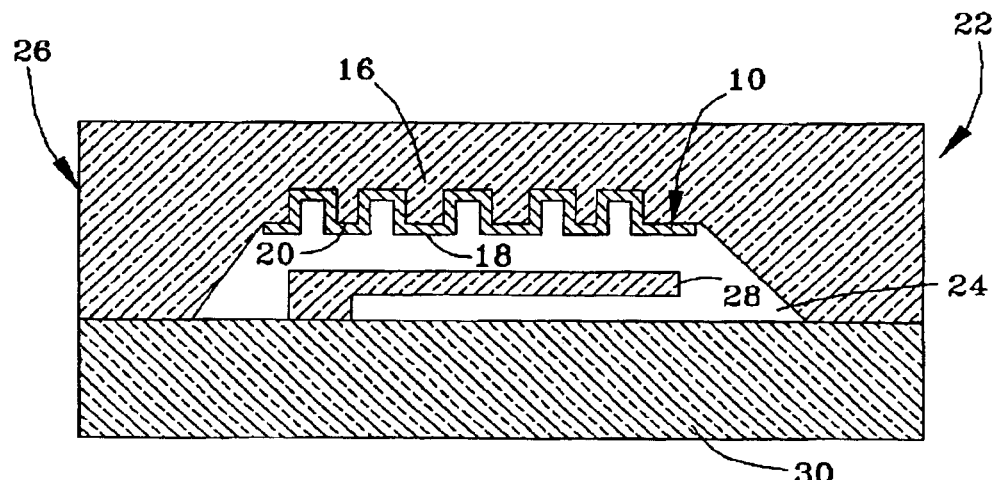
FIGS. 5 and 6 represent cross-sectional views of micromachined devices equipped with getter films in accordance with the invention.
Figure 6:
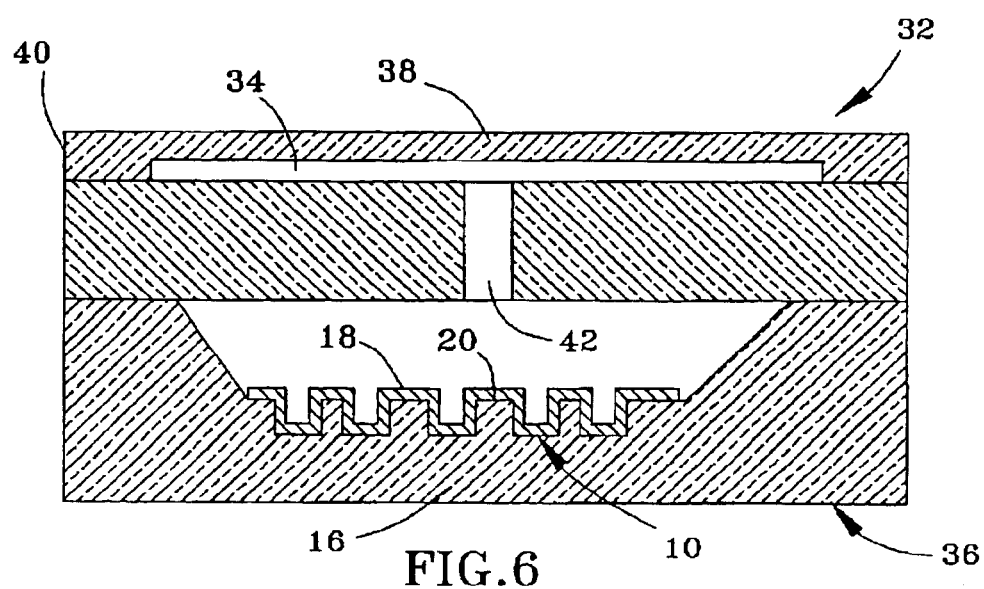

The substrate 16 represented in FIGS. 1 through 4 may be a separate panel or plate intended for direct or indirect attachment to an article using any suitable attachment techniques, or may be a surface region of an article in which the getter film 10 is to be used, as represented in FIGS. 5 and 6. If the substrate 16 is a plate, the flat surface opposite the uneven surface 20 enables the substrate 16 to be mounted to a wall of the article or stacked with other substrates 16 similarly equipped with getter films 10. Any number of plates can be simultaneously formed on a single substrate and then divided into smaller, individual substrate pieces to form discrete getter strips, pellets, washers, etc. The separation of the plates can be accomplished using saws, scribes or lasers, or by breakage along crystallographic planes of the substrate 16. The plate or a stack of plates can then be bonded or otherwise attached to the intended article to form an integrated getter. A stack of multiple plates is useful to form a getter pump capable of reducing the pressure of an enclosed chamber.

The thickness of a plate equipped with the getter film 10 can be reduced by etching, grinding, lapping or polishing the backside of the substrate 16. A protective layer 14 formed of a noble metal is ideal for protecting the reactive layer 12 during a plasma or chemical etch performed for this purpose, as plasmas and liquids capable of etching silicon and glass substrates (e.g., HF, EDP, KOH, TMAH, etc.) will etch most reactive metals but not noble metals. Accordingly, chemical etching selectivity is a preferred aspect of the invention. This selectivity also facilitates forming the getter film 10 as a freestanding metal foil, in which the substrate 16 is a sacrificial layer that is completely removed by etching. In such an embodiment, a second protective film (not shown) is first deposited on the substrate 16, such that the reactive layer 12 is encased and therefore protected on both sides by protective films 14. Again, a noble metal is particularly well suited as the protective layer 14 for this embodiment because of the ability of a noble metal to protect a reactive metal during a lift-off etch to form the freestanding foil.

Once placed in or on an article, e.g., in a chamber, the film 10 can be activated by an appropriate thermal treatment, such as by heating with an external source such as a surrounding electrical coil, resistive heating with an electrical current (Joule heating) passing near or through the film 10, heating with a laser or electron beam, or any other method that will sufficiently heat the film 10 to cause the reactive metal within the reactive layer 12 to diffuse into the protective layer 14. While suitable thermal treatments for this purpose will depend in part on the reactive material used and the thickness and material of the protective layer 14, treatments at about 300° C. to about 500° C. are believed to be sufficient for noble metal protective layers 14 having thicknesses on the order of about 5 to about 500 nm. Under appropriate circumstances, the protective layer 14 could alternatively be removed by sputtering or etching while under vacuum. The protective layer 14 should be of sufficient thickness to not allow significant diffusion of the reactive metal to the surface 18 of the film 10 during processing of the article, particularly before any vacuum wafer bonding step, yet afterwards permit activation of the film 10 (diffusion of the reactive layer 12) such as during wafer bonding or annealing of the wafer stack, so that an adequate amount of reactive metal atoms diffuse through the protective layer 14 for reaction with the gas molecules in the surrounding atmosphere.

As represented in FIGS. 5 and 6, getter films 10 of this invention can be integrated into micromachined wafer processing and designs to improve the performance of vacuum-encapsulated or insulated devices. FIGS. 5 and 6 show micromachined devices 22 and 32 having evacuated chambers 24 and 34, respectively, and which are equipped with a getter film 10 deposited directly on a capping wafer 26 and a bottom wafer 36, respectively. The wafers 26 and 36 are shown as having been bonded, such as glass frit, eutectic, solder or anodically bonded, to device wafers 30 and 40, respectively. As represented in FIG. 5, the capping and device wafers 26 and 30 enclose the getter film 10 along with a resonating tube 28 within the evacuated chamber 24. In FIG. 6, the getter film 10 is enclosed within in a separate region of the wafer stack, with a hole 42 etched to enable gettering of the evacuated chamber 34 adjacent a pressure-sensitive diaphragm 38.

The direct-deposited getter films 10 made possible with this invention are improvements over the conventional approach of using sintered NEG strips, whose particles can break free and create electrical shorts or stop the motion of moving micromachined parts, such as the resonant tube 28 of FIG. 5, the diaphragm 38 of FIG. 6, and tunneling cantilevers. Furthermore, the presence of the protective layer 14 in the getter film 10 enables the use of wafer bonding processes, such as glass frit, eutectic, fusion, solder, anodic and reactive bonding techniques, to produce the devices 22 and 32 of FIGS. 5 and 6. For example, a protective layer 14 formed of a noble metal is capable of preventing the oxidation of the reactive layer 12 during handling and thermal pretreatments typical for these processes, e.g., temperatures of about 100° C. to about 450° C. A protective layer 14 formed of a noble metal can also be used to aid in eutectic or solder bonding, as well as serve functions in providing electrical conduction, electromagnetic shielding, reflection and heating.

Leads can be wire bonded, tab bonded or soldered to the surface of a noble metal protective layer 14 of the getter film 10 prior to thermal activation. By fabricating the film 10 as a stripe or pattern, e.g., serpentine, an electrical current can be passed through the film 10 to sufficiently heat the reactive and protective layers 12 and 14 to activate the film 10, as well as promote the diffusion of gettered gas molecules into the bulk of the film 10. With this approach, getter films 10 can be applied and thermally activated on one or more surfaces of a vacuum enclosure, e.g., a top or bottom cap surface (e.g., 24 or 36) of a micromachined device (e.g., 22 and 32), while another film 10 having a serpentine pattern can be continuously or selectively electrically heated by the application of an electrical current to getter trapped gases throughout the life of the device. Since vacuum degradation of sealed parts is a known problem, a getter film 10 that is configured in this manner can be continuously or selectively heated to diffuse reactive metal to the surface 18 of the film 10 in response to an increase in chamber pressure.

The effectiveness of a getter film 10 fabricated in accordance with this invention was demonstrated with micromachined devices similar to that shown in FIG. 5. Specifically, getter films were deposited by evaporation onto flat interior surfaces of a number of silicon capping wafers, after which glass frit was screen printed on the capping wafers and the wafers were bonded under vacuum to glass wafers. Fabricated on the surface of each glass wafer was a resonating tube of the type disclosed in U.S. Pat. No. 6,477,901 to Tadigadapa et al. The getter film comprised a 2000 Angstrom-thick layer of chromium on the wafer surface, followed by a 2000 Angstrom-thick layer of titanium on the chromium layer (which together defined the reactive layer of the getter film) and, as the protective layer, a 200 Angstrom-thick layer of gold. A shadow mask was used to pattern the getter films, after which the glass frit bonding process was performed at about 390° C. Notably, in the absence of the protective gold layer, the bonding process would have been sufficient to degrade the gettering performance of the chromium-titanium reactive metal film due to oxidation and gas absorption. No further thermal treatment was performed with the specific intent of activating the getter films of this invention. Other micromachined devices were identically processed, but without a getter film of this invention.

As known in the art, the quality (Q) factor of a vibrating element is an indicator of the sealed pressure, with higher Q values corresponding to lower pressures. An exact correlation of pressure and Q factor for a particular vibrating element design can be obtained by testing an uncapped resonator in a vacuum chamber and recording the Q value and chamber pressure as the pressure is gradually reduced in the chamber. In the investigation, the micromachined devices without a getter film had a Q value of about 40 following wafer-to-wafer bonding, which corresponded to a pressure of about 1.5 Torr for the particular resonating tube design evaluated. In contrast, those devices fabricated in accordance with the invention to have a chromium-titanium-gold getter film had Q values ranging from about 950 to about 20,000, corresponding to pressures of about 25 millitorr and less. These results evidenced a considerable improvement in the vacuum quality resulting from the use of the getter film of this invention, and that motion devices (as well as a variety of other devices) could be made with and benefit from the getter film and process of the invention. Notably, the improved vacuum quality was obtained without performing any "activation" step to diffuse titanium and chromium atoms into the gold protective layer, evidencing that the combination of the thinness of the gold layer, the 390° C. bonding temperature, and the mobility of gases, titanium and/or chromium atoms through the gold layer were sufficient to provide a notable gettering effect. Also from these results, it was concluded that as little as 50 Angstroms (5 nm) of a noble metal protective layer deposited by sputtering or evaporation should perform effectively.

In view of the above, it can be seen that the present invention provides an improved getter film 10 containing reactive atoms and/or molecules within a reactive layer 12 that can remain sealed and protected under vacuum by a thin protective layer 14. The protective layer 14 is able to protect the reactive layer 12 during handling and limited heating cycles during the processing of the device in which the film 10 is to be used. Upon final assembly and evacuation of the device, the getter film 10 can be heated to diffuse the reactive material from the reactive layer 12 and through the thin protective layer 14 to the surface 18 of the film 10, and/or diffuse atoms from the protective layer 14 into the reactive layer 12, to the extent that a sufficient amount of the reactive material is present at or near the surface 18 of the getter film 10 to getter gases from the surrounding atmosphere. The getter film 10 may be patterned to have a serpentine shape and electrically wired to permit continuous or selective gettering of gases throughout the life of a vacuum device by passing an electrical current through the getter film 10 in response to an increase in chamber pressure. As a result of these techniques, reactive atoms are present at or sufficiently near the surface 18 of the getter film 10 so as to combine with gases in the surrounding atmosphere to lower the pressure of a chamber in which the getter film 10 has been placed.

While particular vacuum devices 22 and 32 are depicted in FIGS. 5 and 6, the getter film 10 of this invention can be used in a variety of vacuum systems, such as displays, lighting, lamps, cathode ray tube (CRT) electronics, particle accelerators, tunneling devices, resonators, gyroscopes, angular rate sensors, accelerometers, pressure sensors, radio (rf) resonators, voltage controlled oscillators, chemical sensors, infrared sensors, bolometers, vacuum emission electronics, vacuum displays, and various other devices requiring an enclosed vacuum. Wafers or foils coated with or formed of getter films 10 of this invention can also be used to form gas purification filters, or as a solid state vacuum pump. Alternatively, films within the scope of this invention can be formed to have a reactive material layer that when activated yields a chemically reactive surface for use as a catalyst, chemical processing or an analytical tool. Furthermore, a film constructed in accordance with this invention can perform a variety of other or additional functions, such as carrying electrical signals, as a heater, optical reflector, as an etch masking layer, a diffusion barrier, a solderable or eutectic wafer bond adhesion layer, vacuum sealing plug, electromagnetic shield, etc. Also, while getter films 10 deposited on plates and wafer surfaces are notable embodiments of the invention, suitable getter films could be provided in various other forms, including strips and pellets, as well as placed in equipment used to process vacuum devices, such as walls of a particle accelerator, semiconductor processing equipment, analytical equipment, and vacuum chucks for holding wafers.

In view of the above, while the invention has been described in terms of a preferred embodiment, it is apparent that other forms could be adopted by one skilled in the art. Therefore, the scope of the invention is to be limited only by the following claims.

What is claimed is:

1. An article comprising a closed evacuated chamber containing an atmosphere, a surface within the chamber, a first layer of a reactive material of chromium supported by the surface, and a second layer of a substantially nonreactive material of gold between the first layer and the atmosphere within the chamber, the second layer being sufficiently thin and sufficiently interdiffused with the first layer so that at least a portion of the reactive material of the first layer is able to react with the atmosphere within the chamber, wherein the first and second layers constitute a getter material within the chamber.

2. An article according to claim 1, wherein the article is an electronic device.

3. An article according to claim 1, wherein the surface is defined by the chamber, the first layer is on the surface, and the second layer overlies the first layer.

4. An article according to claim 3, wherein the surface is uneven such that the second layer defines an outer uneven surface exposed to the atmosphere.

5. An article according to claim 1, further comprising a third layer of a substantially nonreactive material, the first layer being between the second and third layers, the first, second and third layers defining a foil supported by the surface.

6. An article according to claim 1, further comprising means for heating the first and second layers.

7. An electronic device comprising an evacuated chamber and a getter material within the chamber, the getter material comprising a first layer of a reactive material of titanium on a substrate region within the chamber of the device, and a second layer of a substantially nonreactive material on the first layer, the second layer protecting the first layer from an atmosphere within the chamber, the reactive material of the first layer being interdiffused with the second layer so that some but not all of the reactive material is present in the second layer and at or near an outer surface of the getter material, wherein the nonreactive material of the second layer is chosen from the group consisting of Pb, Sn, In, and all Group 8A, 1B, 2B, and 3B metals except Al.

8. An electronic device according to claim 7, wherein some of the reactive material is present at the outer surface of the second layer.

9. An article according to claim 8, wherein the article further comprises a plate secured within the chamber and the surface is defined by the plate.

10. An article according to claim 9, wherein the surface is an uneven surface of the plate and the getter material is a deposit on the uneven surface of the plate such that the getter material has an outer uneven surface exposed to the surrounding atmosphere.

11. An article according to claim 8, wherein the getter material is a deposit on the surface within the chamber.

12. An article according to claim 11, wherein the surface is uneven such that the getter material has an outer uneven surface exposed to the surrounding atmosphere within the chamber.

13. An article according to claim 8, wherein the getter material defines a film.

14. An article according to claim 8, further comprising means enclosed with the first and second layers within the chamber for heating the getter material.

15. An article according to claim 8, wherein the article is an electronic device.

16. An electronic device according to claim 7, wherein the getter material is on an uneven surface such that the getter material has an outer uneven surface exposed to the atmosphere.

17. An electronic device according to claim 7, wherein the uneven surface is a surface of the chamber.

18. An electronic device according to claim 7, further comprising means within the chamber for heating the getter material.

19. An electronic device according to claim 18, wherein the heating means comprises the getter material and means for passing a current through the getter material for resistively heating the getter material.

20. An electronic device according to claim 7, wherein the nonreactive material of the second layer is chosen from the group consisting of Ag, Au, Cu, Ir, Os, Pd, and Pt.

* * * * *